(12) United States Patent
Uchida

(10) Patent No.: US 8,044,518 B2
(45) Date of Patent: Oct. 25, 2011

(54) JUNCTION MEMBER COMPRISING JUNCTION PADS ARRANGED IN MATRIX AND MULTICHIP PACKAGE USING SAME

(75) Inventor: Yasufumi Uchida, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 10/960,495

(22) Filed: Oct. 8, 2004

(65) Prior Publication Data

US 2005/0161792 A1 Jul. 28, 2005

(30) Foreign Application Priority Data

Jan. 23, 2004 (JP) .................................. 2004-015131

(51) Int. Cl.
*H01L 23/538* (2006.01)
*H01L 23/498* (2006.01)

(52) U.S. Cl. ... 257/773; 257/723; 257/777; 257/E23.07; 257/E23.175

(58) Field of Classification Search .................. 257/666, 257/686, 723, 777, 784, 773, 776, E23.01, 257/E23.011, E23.06, E23.062, E23.068, 257/E23.07, E23.141, E23.142, E23.143, 257/E23.151, E23.168, E23.169, E23.17, 257/E23.173, E23.175
See application file for complete search history.

(56) References Cited

U.S. PATENT DOCUMENTS

| 5,354,955 | A  | * | 10/1994 | Gregor et al. ................. 174/250 |
| 6,278,616 | B1 | * | 8/2001  | Gelsomini et al. ............ 361/803 |
| 6,351,040 | B1 | * | 2/2002  | Schoenfeld ................... 257/784 |
| 6,392,950 | B2 |   | 5/2002  | Ayukawa et al. |
| 6,421,254 | B2 | * | 7/2002  | Crane et al. ................... 361/820 |
| 6,552,418 | B2 | * | 4/2003  | Misumi et al. ................ 257/666 |
| 6,916,686 | B2 |   | 7/2005  | Wada et al. |
| 6,979,905 | B2 | * | 12/2005 | Nishida et al. ................ 257/777 |
| 7,098,528 | B2 | * | 8/2006  | Vasishta et al. ............... 257/668 |
| 2003/0153122 | A1 | * | 8/2003 | Brooks ......................... 438/107 |

FOREIGN PATENT DOCUMENTS

| JP | 07-050315   | 2/1995  |
| JP | 08-288453   | 11/1996 |
| JP | 2001-177050 | 6/2001  |
| JP | 2001-344967 | 12/2001 |
| JP | 2002-93993  | 3/2002  |
| JP | 2003-234359 | 8/2003  |

OTHER PUBLICATIONS

English-Language Machine Translation of JP 2001-177050. Retreived Sep. 29, 2008 from JPO webpage.*

* cited by examiner

*Primary Examiner* — Samuel Gebremariam
*Assistant Examiner* — Andrew O. Arena
(74) *Attorney, Agent, or Firm* — Rabin & Berdo, P.C.

(57) ABSTRACT

A second semiconductor chip and a junction member are mounted on a first semiconductor chip formed with a plurality of first pads on a surface thereof. A resin encapsulating body is provided which seals the first semiconductor chip, the second semiconductor chip and the junction member. The second semiconductor chip includes a plurality of second pads arranged in a central part thereof. The junction member includes first junction pads, second junction pads and connecting portions which connect the first junction pads and the second junction pads respectively. Electrical connections of the second semiconductor chip from the second pads include connections to connecting terminals and connections to the connecting terminals or the first semiconductor chip from the second junction pads via the first junction pads.

22 Claims, 7 Drawing Sheets

(a)

(b)

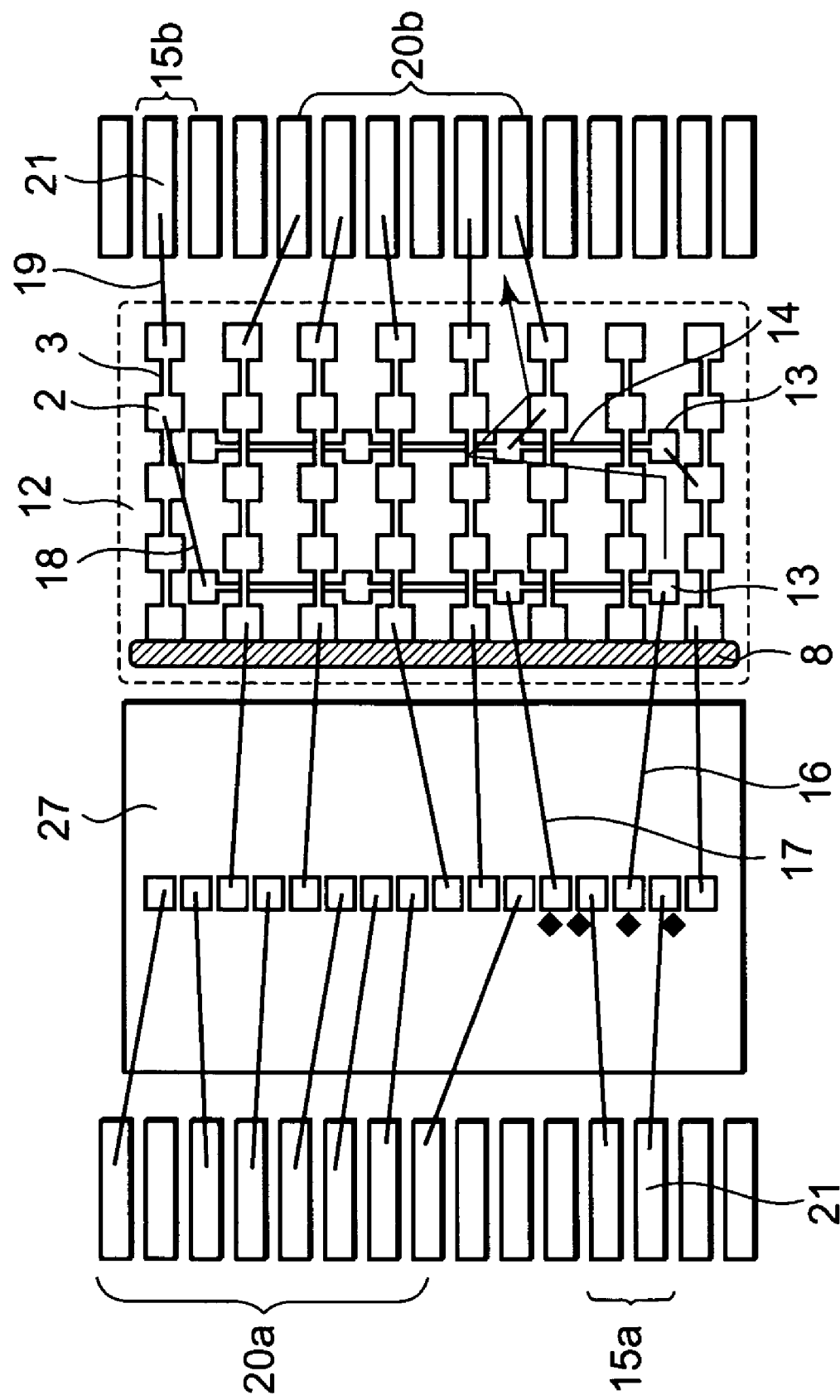

JUNCTION MEMBER COMPRISING JUNCTION PADS ARRANGED IN MATRIX AND MULTICHIP PACKAGE USING SAME

BACKGROUND OF THE INVENTION

1. Field of the Invention

The present invention relates to a multichip package (hereinafter abbreviated as "MCP") wherein a plurality of semiconductor chips are mounted in one package, and particularly to an MCP with center-pad type semiconductor chips mounted therein.

2. Description of the Related Art

There has recently been increasingly demand for a size reduction of a semiconductor device with a request for miniaturization of electronic equipment. As one method for realizing the miniaturization of the semiconductor device, there has been proposed a semiconductor device having a multichip package (MCP) structure wherein a plurality of semiconductor chips are mounted in one package. Among others, a package with center pad type semiconductor chips mounted therein becomes a familiar sight on a DRAM (Dynamic Random Access Memory) or the like. The center pad type semiconductor chip is extremely advantageous in view of its size reduction and increase in capacity in that the area of the semiconductor chip occupied in an encapsulating resin is large as compared with a semiconductor chip having pads disposed therearound. The above-described contents have been described in the following patent document 1, for example.

Patent Document 1

Japanese Unexamined Patent Publication No. 2002-093993

However, although the center pad type semiconductor chip is advantageous in view of its size reduction and increase in capacity as described even in the patent document 1, it is not possible to avoid an increase in the distance from each of pads to its corresponding inner lead upon wire bonding since the pads are placed in the center of the semiconductor chip. A problem arises in that with an increase in wire length, a short occurs due to wire's contact with a chip end or a short occurs between adjacent wires upon resin sealing.

SUMMARY OF THE INVENTION

The present invention has been made to solve the foregoing problems. Therefore, the present invention aims to provide a junction member capable of keeping a wire length short and providing high yields and a multichip package using the junction member, while serving as the multichip package with the center pad type semiconductor chips mounted therein.

According to one aspect of the present invention, for achieving the above object, there is provided a multichip package, comprising:

a first semiconductor chip formed with a plurality of first pads on a surface thereof;
a second semiconductor chip;
a junction member; and
a resin encapsulating body which seals the first semiconductor chip, the second semiconductor chip and the junction member,
the second semiconductor chip and the junction member being mounted on the first semiconductor chip,
wherein the second semiconductor chip includes a plurality of second pads arranged in a central part thereof,
wherein the junction member includes first junction pads, second junction pads and connecting portions which connect the first junction pads and the second junction pads respectively, and
wherein electrical connections of the second semiconductor chip from the second pads include connections to connecting terminals and connections to the connecting terminals or the first semiconductor chip from the second junction pads via the first junction pads.

According to another aspect of the present invention, for achieving the above object, there is provided a rectangular junction member which transfers electric signals of a semiconductor chip having a circuit function to connecting terminals respectively, comprising:

a plurality of junction pads formed on a substrate; and
pad connecting portions that connect the junction pads adjacent to one another.

In the present invention, the length of each wire can be shortened because the multichip package is configured using the junction member. It is also possible to reduce a short to a chip edge and a short between the wires at resin encapsulation due to sagging of the wire. Sine the previous junction member is configured so as to connect the plurality of junction pads by their corresponding pad connecting portions, junction members of various sizes can be fabricated. A junction member can be realized which adapts to combinations of various chip sizes.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 9 is a wired example of the junction member according to the third embodiment shown in FIG. 7.

DETAILED DESCRIPTION OF THE INVENTION

Preferred embodiments of the present invention will hereinafter be described with reference to the accompanying drawings.

First Embodiment

Figure 1:
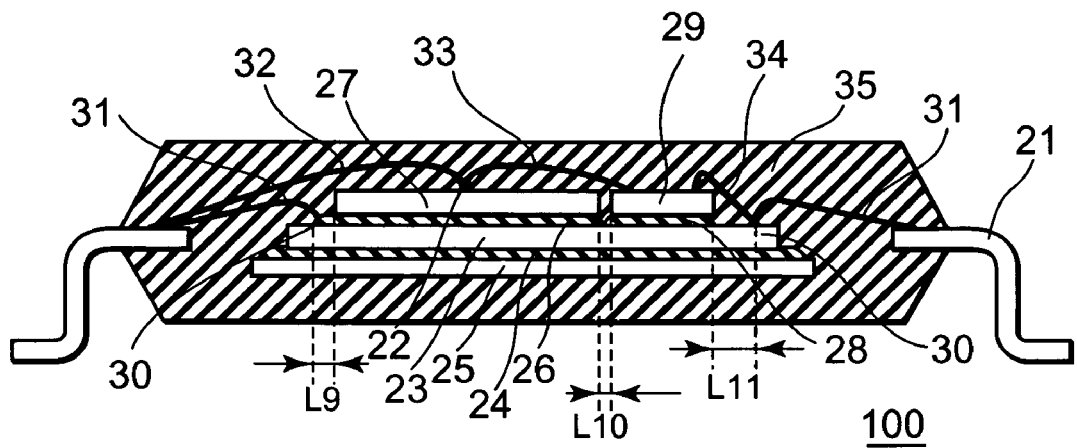
FIG. 1 is a cross-sectional view of a multichip package according to a first embodiment of the present invention.
Figure 2:
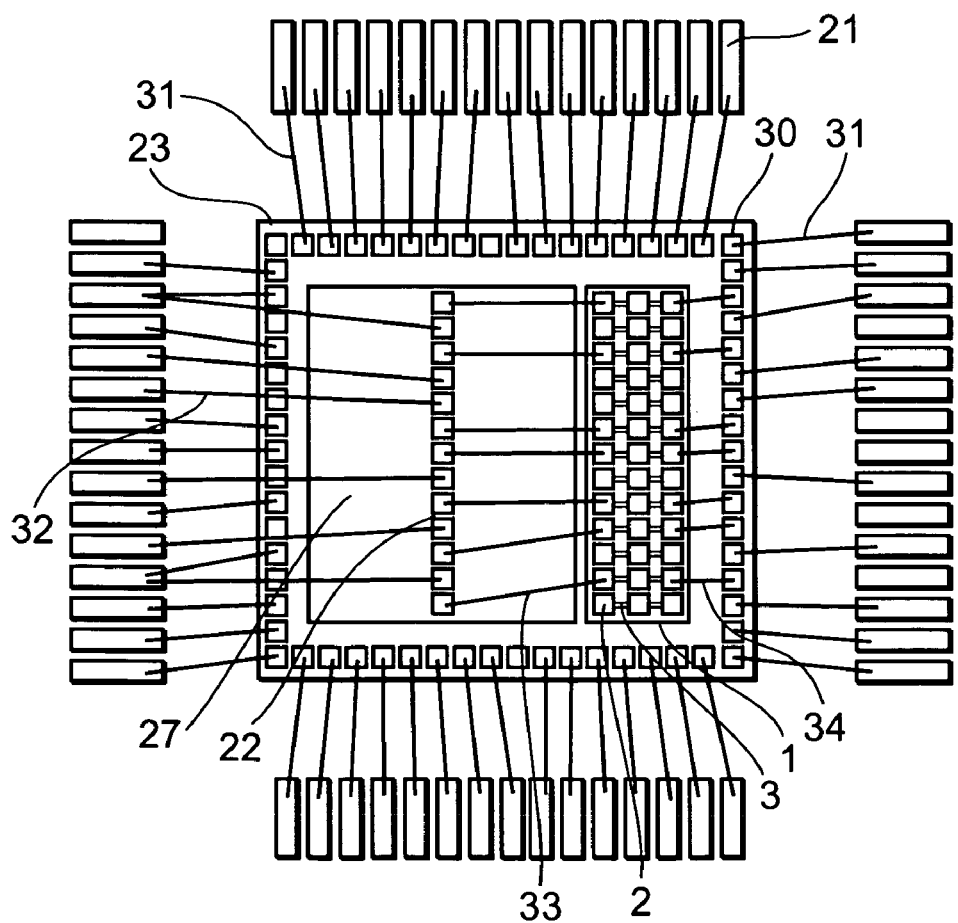
FIG. 2 is a top view of the multichip package according to the first embodiment of the present invention.

FIG. 1 is a cross-sectional view showing a multichip package according to a first embodiment of the present invention. FIG. 2 is a top view illustrating the multichip package according to the first embodiment of the present invention.

A structure of the multichip package 100 shown in FIGS. 1 and 2 will first be explained. A first semiconductor element 23 is bonded onto a die pad 25 by a first adhesive agent 24. A second semiconductor element 27 is bonded onto the first semiconductor element 23 by a second adhesive agent 26. A junction member 29 is adhered onto the first semiconductor element 23 by a third adhesive agent 28. First pads 30 are formed over the first semiconductor element 23. Second pads 22 are formed substantially in the center on the second semiconductor element 27. Junction pads 2 and pad connecting portions 3 that electrically connect between the junction pads 2 are formed on the junction member 29. The second semiconductor element 27 is bonded onto the first semiconductor element 23 in such a manner that the distance L9 between the end of the second semiconductor element 27 and each of the first pads 30 ranges from approximately 0.2 to 1.0 mm. The junction member 29 is bonded onto the first semiconductor element 23 in such a manner that the distance L10 between the end of the second semiconductor element 27 and the end of the junction member 29 ranges from approximately 0.2 to 1.0 mm and the distance L11 between the end of the junction member 29 and each of the first pads 30 ranges from approximately 0.4 to 1.0 mm.

The first pads 30 and lead frame terminals 21 are respectively electrically connected to one another by first metal wires 31. The second pads 22 and lead frame terminals 21 are respectively electrically connected to one another by second metal wires 32. The second pads 22 and the junction pads 2 are respectively electrically connected to one another by third metal wires 33. The junction pads 2 and the first pads 30 are respectively electrically connected to one another by fourth metal wires 34. Although the lead frame terminals 21 are illustrated by way of example in the present embodiment, any one may be used if connecting terminals are taken. It is needless to say that no limitation is imposed on the lead frame terminals 21.

In the present embodiment, the junction member 29 comprises the junction pads 2 and the pad connecting portions 3. Patterning for forming each circuit is not effected on the junction member 29. The junction member 29 has the function of bypassing electric signals sent from the second semiconductor element 27 to their corresponding first pads 30 of the first semiconductor element 23. Also the junction member 29 has a thickness equal to or larger than that of the second semiconductor element 27. The first semiconductor element 23, the second semiconductor element 27 and the junction member 29 are sealed with a mold resin.

The multichip package 100 according to the first embodiment of the present invention makes it possible to cause the second semiconductor element 27 to approach the first pads 30 by having the above configuration. Owing to the above configuration, the distance from each of the second pads 22 to the end of the second semiconductor element 27 can be set to more than or equal to ¾ of the distance between the first pad and the second pad. Thus, the second metal wires 32 can be kept short, thereby preventing deformation of each wire upon sealing by the mold resin 35. It is also possible to prevent shorts between the second metal wires 32.

Owing to the mounting of the junction member 29, the direct electrical connections of the second pads 22 to the first pads 30 are avoided so that the third metal wires 33 can be held to 3 mm or less. Since the thickness of the junction member 29 is set equal to or greater than that of the semiconductor element 27, short-circuiting of the third metal wires 33 to the end of the second semiconductor element 27 can be prevented.

FIG. 2 shows that the second pads 22 are arranged along a second direction (vertical in FIG. 2) that is substantially perpendicular to a first direction (left-right in FIG. 2), and the second pads 22 are deployed in a single line along the second direction. FIG. 2 also shows that the junction pads 2 are arranged or disposed in a rectangular matrix or array, and that this matrix or array is a complete matrix or array, meaning that each position in the matrix or array is occupied by a junction pad 2.

Second Embodiment

Figure 3:
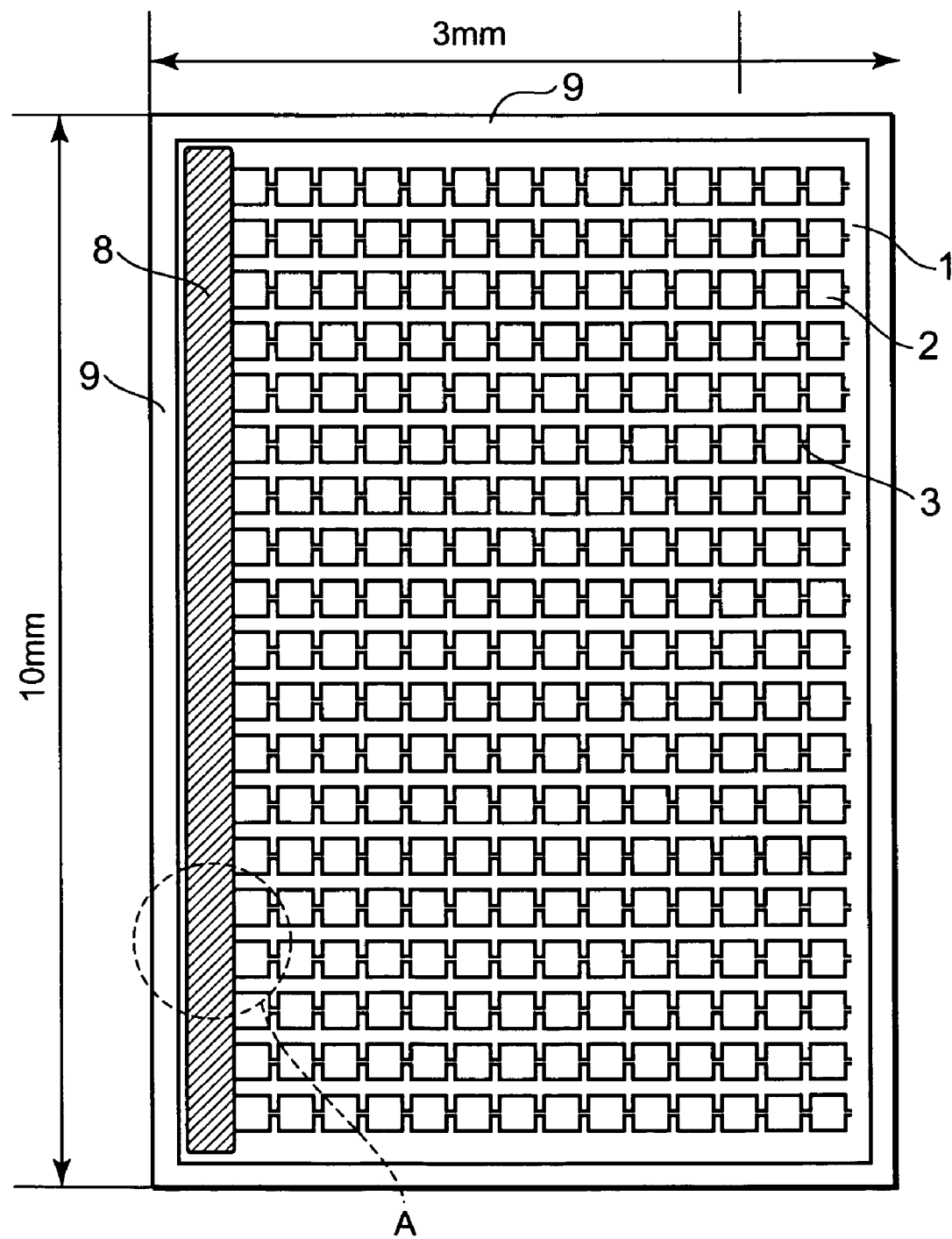
FIG. 3 is a top view of a junction member according to a second embodiment of the present invention.
Figure 4:
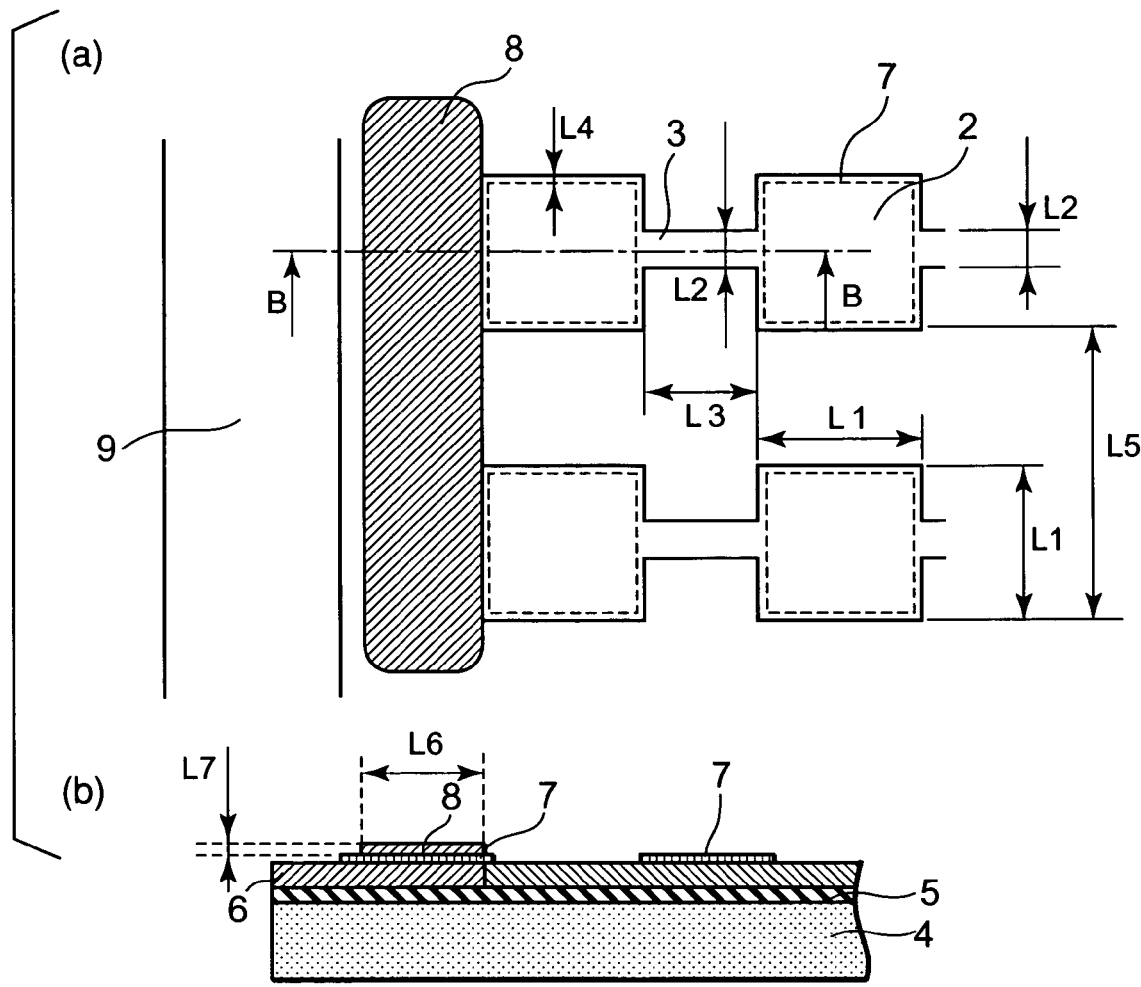
FIG. 4(a) is a top view of a portion A of the junction member according to the second embodiment of the present invention shown in FIG. 3.
FIG. 4(b) is a cross-sectional view taken along line B-B, of the junction member according to the second embodiment of the present invention.
Figure 5:
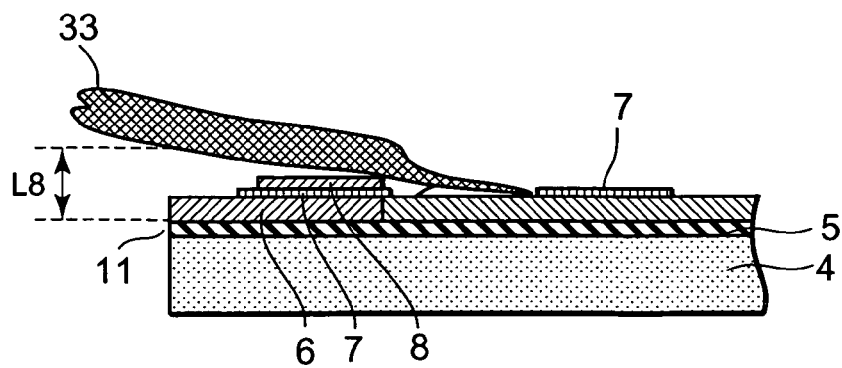
FIG. 5 is a cross-sectional view at wire bonging, of the portion A of the junction member according to the second embodiment of the present invention shown in FIG. 3.

FIG. 3 is a top view showing a junction member according to a second embodiment of the present invention. FIG. 4(a) is a top view illustrating a portion A of the junction member according to the second embodiment of the present invention shown in FIG. 3. FIG. 4(b) is a cross-sectional view taken along line B-B, of the junction member according to the second embodiment of the present invention shown in FIG. 3. FIG. 5 is a cross-sectional view at wire bonding, of the portion A of the junction member according to the second embodiment of the present invention.

As shown in FIGS. 3 and 5, the junction member 1 is rectangular. Although the rectangle is illustrated by way of example in the present embodiment, the present invention is not limited to it alone. Any one may be used if rectangular. It is also considered that a plurality of the junction members 1 are used according to circumstances. In the present embodiment, the length of the short side of the junction member 1 is approximately 3 mm and the length of the long side thereof is about 10 mm or so. In the junction member 1, a first insulating film 5 is formed on a silicon substrate 4. Junction pads 2, pad connecting portions 3 and an interlayer insulating film 6 are formed on the first insulating film 5. The junction pads 2 are arranged in matrix form. The junction pads 2 adjacent to one another in the short-side direction of the junction member 1 are respectively electrically connected to one another by means of the pad connecting portions 3. In the present embodiment, the junction pads 2 and the pad connecting portions 3 are formed of metal wirings such as aluminum or copper. Areas in which the junction pads 2 and the pad connecting portions 3 are formed and an area in which the interlayer insulating film 6 is formed, are provided on the first insulating film 5. Passivation films 7 made of glass or the like each used as a first protective film cover the interlayer insulating film 6 and the pad connecting portions 3 from thereabove. The passivation film 7 is formed even on the inner periphery of each junction pad 2 as the case may be. Now, the inner periphery of the junction pad 2 indicates the inside that extends along the outer sides of the junction pad 2. A buffer coat film 8 made of an insulating material such as polyimide is formed on the passivation films 7 and in the inner periphery of the junction member 1. The buffer coat film 8 may be formed in the longitudinal direction of the junction member 1 at the minimum. However, the formation of the buffer coat film 8 along only one side extending in the longitudinal direction of the junction member 1 is most suitable where the cutting-out to be described later is taken into consideration. Although the silicon substrate 4 is taken as the substrate by way of example in the present embodiment, the substrate is by no means limited to it alone. A sapphire substrate and a glass substrate or the like may be used. However, the use of the semiconductor substrate brings about the advantage that a semiconductor process is applicable using the already-existing device.

A scribe line 9 corresponding to each of cut widths at fractionalizing processing of on-assembly chips is provided at the inner peripheral end of the junction member 1. The junction member 1 according to the present embodiment does not include wirings other than the junction pads 2 and the pad connecting portions 3 and has no circuit function virtually.

Referring to FIG. 4(a), the detailed sizes of the respective portions will be shown. The lengthwise and crosswise sizes of each of the junction pads 2 are both about L1=about 90 μm. A width L2 of each of the pad connecting portions 3 is smaller than an interval L3 between the mutually connected junction pads 2 and ranges from approximately 5 to 50 μm. The interval L3 between the junction pads 2 connected to each other ranges from approximately 50 to 100 μm. Pitches L5 of the junction pads 2 adjacent to each other in the longitudinal direction of the junction member 1 are arranged so as to range from approximately 150 to 200 μm. A width L4 of each of the passivation films 7 on the junction pads 2 is about 5 μm. A width L6 of the buffer coat film 8 ranges from approximately 50 to 100 μm and its thickness ranges from about 3 μm to about 8 μm.

Figure 6:
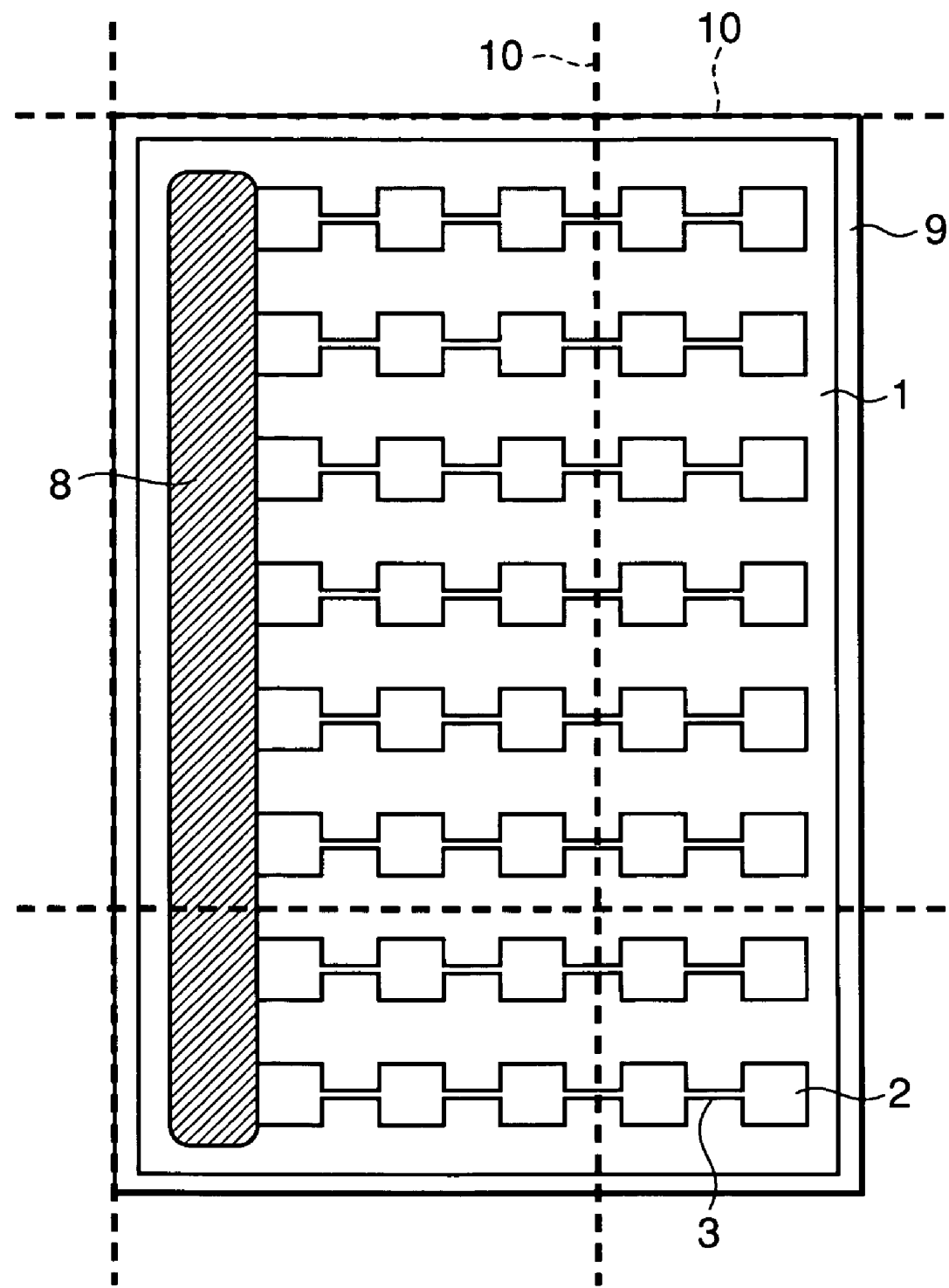
FIG. 6 is a top view showing positions at the cutting of the junction member according to the second embodiment of the present invention shown in FIG. 3.

FIG. 6 is a top view showing positions at the cutting of the junction member according to the second embodiment of the present invention. A method of applying the junction member 1 will be explained with reference to FIG. 6. The present figure shows, as an example, the case in which the buffer coat film 8 is formed on only one side of the junction member 1. When the required sizes are determined, scribe positions 10 are determined. The scribe positions 10 are cut in the neighborhood of the positions where the necessary sizes are obtained, with the end of the side on which the buffer coat film 8 exists being regarded as the reference. As to the cutting of the junction member 1 as viewed in its transverse direction, cutting is done between the junction pads 2 adjacent to one another in the longitudinal direction of the junction member 1. As to the cutting of the junction member 1 as viewed in its longitudinal direction, the neighborhood of the center of each pad connecting portion 3 is cut. Incidentally, the cutting is executed in a scribed process corresponding to a conventional chip cutting process.

Owing to the above configuration of the junction member 1 according to the second embodiment, the distance L8 between each of the third metal wires 33 and a silicon exposed portion 11 exposed upon cutting of the junction member 1 can sufficiently be ensured because the buffer coat film 8 is provided, where the third metal wires 33 are wired. Thus, the third metal wire 33 and the silicon exposed portion 11 can be prevented from being electrically short-circuited.

Further, since the width L2 of each pad connecting portion 3 is set smaller than the interval L3 between the junction pads 2 connected to one another, the length of a cut chip of the pad connecting portion 3, which occurs upon the cutting in the scribe process, becomes shorter than the interval L3 between the junction pads 2 connected to each other. It ranges from L5 to L1≧L2. Thus, it is possible to prevent a short developed between the junction pads 2 adjacent to one another in the longitudinal direction of the junction member 1 due to the cut chip.

Further, the interval L3 between the junction pads 2 connected to one another ranges from 50 μm to 100 μm and the pitch L5 of each of the junction pads 2 adjacent to one another in the longitudinal direction of the junction member 1 ranges from 150 μm to 200 μm. Therefore, the interval necessary for the cutting in the scribe process can be set larger than 50 μm and the junction member 1 can be cut out without contacting the junction pads 2.

Furthermore, since the junction member 1 is cut out after the sizes have been determined with the end of the buffer coat film 8 as the reference, it can easily be changed to various sizes as needed, thereby improving general versatility. A spot to cut the buffer coat film 8 becomes only one spot, and the direction to cut it becomes only the transverse direction of the junction member 1. The buffer coat film 8 has the feature that it is apt to be peeled due to damage of cutting upon the scribe process. Since, however, the number of cuttings of the buffer coat film 8 and its cut distance can be respectively suppressed to the minimum, the peeling of the buffer coat film 8 can be prevented from occurring.

Third Embodiment

A third embodiment of the present invention will next be explained. FIG. 7(a) is a top view of a junction member according to the third embodiment. FIG. 7(b) is an enlarged view of a portion B of the junction member according to the third embodiment. Incidentally, the same elements of structure as those employed in the second embodiment are respectively identified by the same reference numerals upon explanation of a structure of the junction member according to the third embodiment and its manufacturing method.

A point of difference between the structure of the junction member 1 according to the second embodiment of the present invention and the structure of the junction member 12 according to the third embodiment of the present invention resides in that sub pads 13 and sub pad connecting portions 14 have been added. The sub pads 13 are formed between pad connecting portions 2 adjacent to one another as viewed in the longitudinal direction of the junction member 12. The sub pad connecting portions 14, which electrically connect the adjoining sub pads 13, are formed in the longitudinal direction of the junction member 12. The sub pads 13 and the sub pad connecting portions 14 substantially vertically intersect an arrangement of the junction pads 2 and their corresponding pad connecting portions 3. Since, however, the arrangement of the junction pads 2 and the pad connecting portions 3, and the sub pads 13 and the sub pad connecting pads 14 are respectively formed in different layers, they are not short-circuited to one another.

Figure 7:
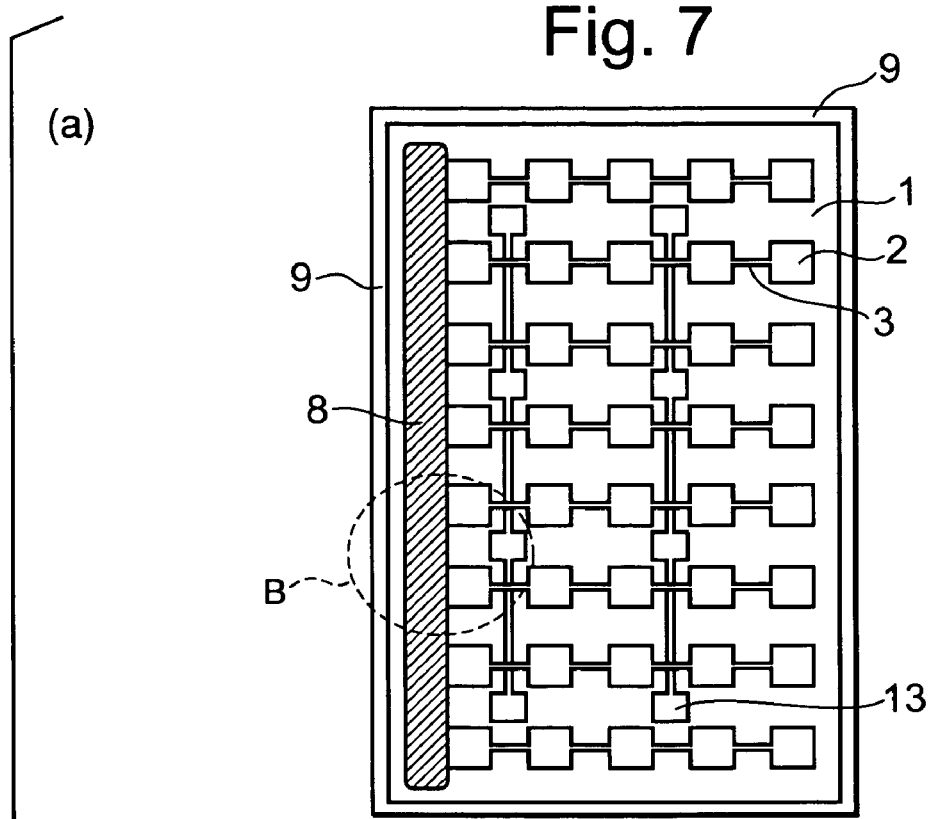
FIG. 7(a) is a top view of a junction member according to a third embodiment of the present invention.
FIG. 7(b) is an enlarged view of a portion B of the junction member according to the third embodiment of the present invention.
Figure 7:
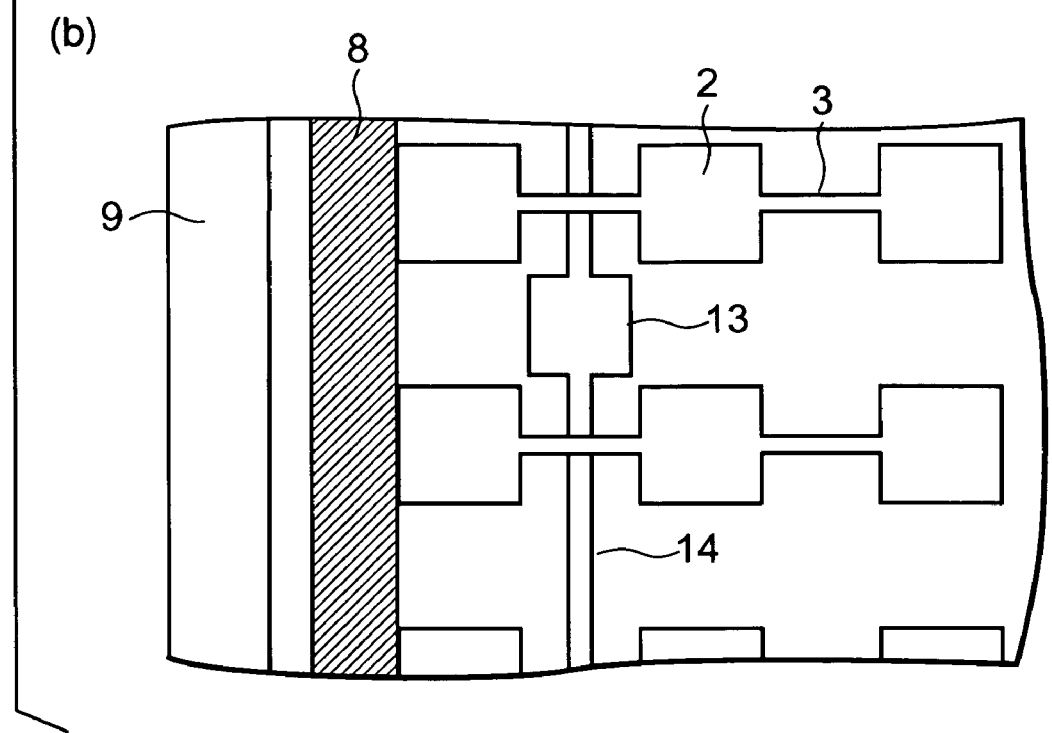

The sub pads 13 and the sub pad connecting portions 14 are arranged on alternate columns with respect to columns of the junction pads 2 as viewed in the transverse direction of the junction member 12. However, the sub pads 13 and the sub pad connecting portions 14 may be arranged on alternate plural columns as needed and are not limited to the alternate columns. Similarly, although the sub pads 13 are arranged every rows as viewed in the longitudinal direction of the junction member 12 as shown in FIG. 7, the sub pads 13 may be arranged on alternate plural rows.

Figure 8:
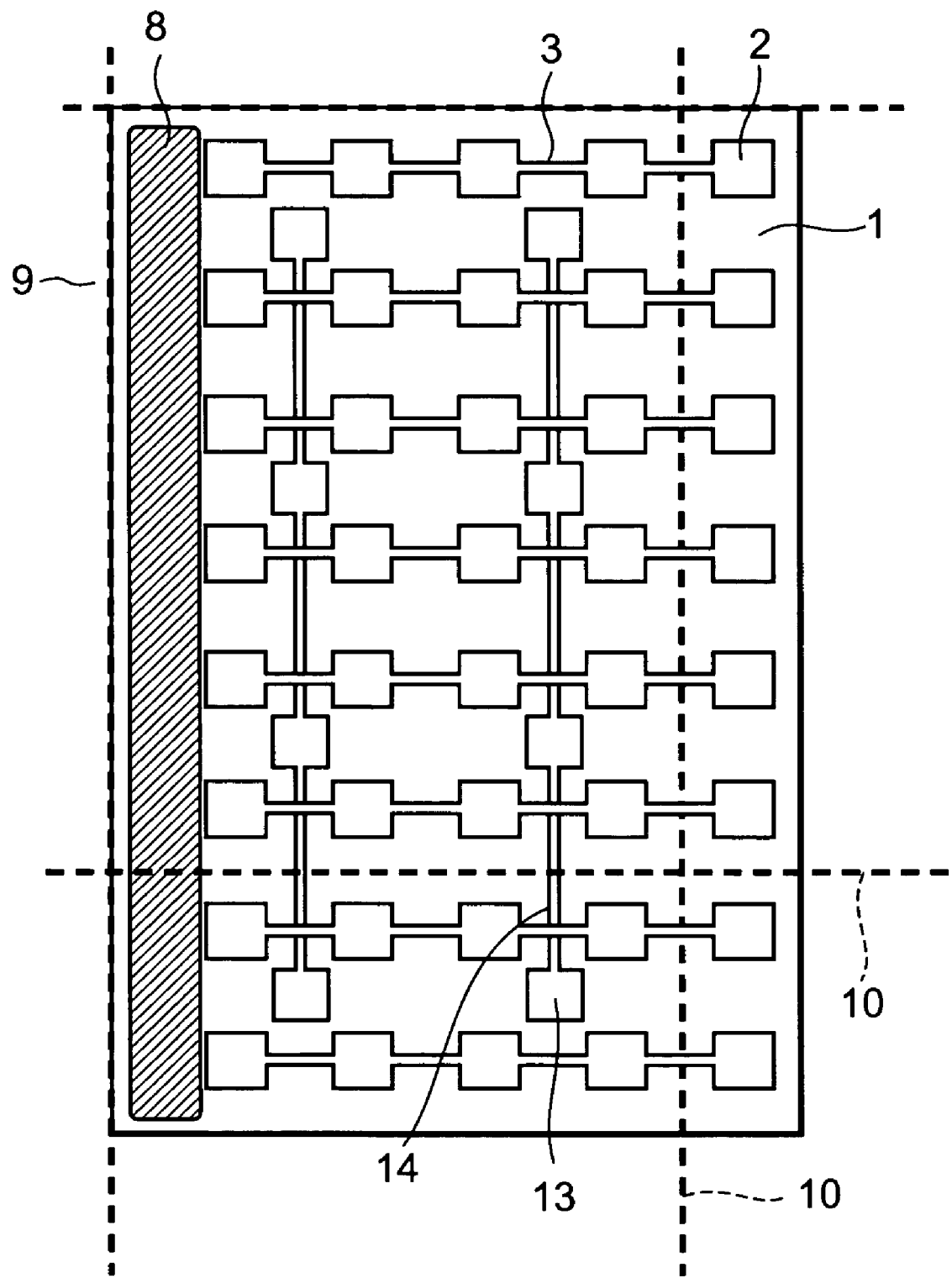
FIG. 8 is a top view showing positions at the cutting of the junction member according to the third embodiment shown in FIG. 7.

FIG. 8 is a top view showing positions at the cutting of the junction member according to the third embodiment of the present invention shown in FIG. 7(a). A method of applying the junction member 12 will be explained with reference to FIG. 8. However, the description of the contents similar to FIG. 6 illustrative of the positions at the cutting of the second embodiment of the present invention will be omitted. A description will be made of the difference between the positions at the cutting of the third embodiment of the present invention and the positions at the cutting of the second embodiment.

Each of the cutting positions of the junction member 12 as viewed in the transverse direction thereof is placed between the junction pads 2 between which no sub pads 13 are disposed. Each of the cutting positions of the junction member 12 as viewed in the longitudinal direction thereof is placed between the junction pads 2 between which the sub pads 13 and the sub pad connecting portions 14 are not provided.

Owing to the setting of the above cutting positions, the number of times in which the sub pad connecting portions 14 are cut, can be suppressed to the minimum. It is thus possible to prevent shorts developed between the junction pads 2 and the sub pad connecting portions 14 due to the cut chip.

FIG. 9 is a wired example using the junction member according to the third embodiment of the present invention shown in FIG. 7. Of second pads 22 of a second semiconductor element 27, ones marked with black dots are second pads 22 for a power supply. There may be cases in which the power supply second pads 22 are connected to their corresponding lead frame terminals 21 corresponding to power supply pins 15a and connected to their corresponding sub pads 13 of the junction member 12. The sub pad 13 and its corresponding junction pad 2 are wire-bonded to each other by a pad junction wire 18. The other junction pad 2 electrically made conductive to its corresponding previous junction pad 2, and a lead frame terminal 21 for a power supply pin 15b are wire-bonded to each other by a pad junction wire 19. The address second pads 22 of the second semiconductor element 27 are electrically connected to their corresponding lead frame terminals 21 for address pins 20b by wire bonding, using desired junction pads of the junction member 12. A partial flow of an electric signal is indicated by a dotted line.

Owing to the execution of above connections, the layout of the power pins 15a and 15b and the layout of the address pins 20 can freely be changed, thus making it possible to improve the degree of freedom of wiring.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A multichip package, comprising:
a plurality of connecting terminals arranged in a peripheral area of the package, the connecting terminals including first connecting terminals arranged in a first-side peripheral area of the package and second connecting terminals arranged in a second-side peripheral area of the package opposite to the first-side peripheral area;
a die pad;
a first semiconductor chip disposed on the die pad, the first semiconductor chip including a central surface, and a peripheral surface on which a plurality of first pads are formed, the first semiconductor chip being located within the peripheral area including the connecting terminals;
a second semiconductor chip disposed on the central surface of the first semiconductor chip, the second semiconductor chip being disposed closer to the first connecting terminals than the second connecting terminals, the second semiconductor chip including a plurality of second pads arranged in a central part thereof such that a distance from each second pad to a vertical edge of the second semiconductor chip that faces the first connecting terminals is substantially the same as a distance from each second pad to an opposite vertical edge of the second semiconductor chip that faces the second connecting terminals;
a junction member disposed on the central surface of the first semiconductor chip, the junction member being disposed closer to the second connecting terminals than the first connecting terminals, the junction member including junction pads and pad connecting portions, the junction pads consisting of a plurality of junction pads all arranged in at least one rectangular matrix, wherein each of the matrices in which all the junction pads are arranged is a large m×n matrix where m and n are both integers greater than two; and
a resin encapsulating body which seals the first semiconductor chip, the second semiconductor chip, and the junction member,
wherein the second semiconductor chip and the junction member are arranged along a first direction that extends from the first-side peripheral area to the second-side peripheral area of the package, and
wherein the junction pads including m rows, each row extending along the first direction, each row including n junction pads that are electrically connected to one another along the first direction by the pad connecting portions, the junction pads in each row being arranged side-by-side, each pad connecting portion in each row being disposed between two adjacent junction pads, a size of each junction pad being larger than a size of each pad connecting portion, and
wherein the second pads include a first central pad and a second central pad, the first central pad being directly connected to one of the first connecting terminals, the second central pad being connected to a first junction pad that is most adjacent to the first-side peripheral area in a row of the junction pads, a second junction pad that is most adjacent to the second-side peripheral area in the row being directly connected to one of the first pads, and
wherein the connecting terminals are lead terminals extending outward from the package, and each lead terminal has a connecting portion for connecting to the first semiconductor chip or the second semiconductor chip, and
wherein each connecting portion of the first and second terminals is disposed at a level higher than the die pad and lower than the second semiconductor chip and the junction member.

2. The multichip package according to claim 1, wherein the first pads and the junction pads are respectively wire-bonded to the connecting terminals.

3. The multichip package according to claim 2, wherein a distance extending from each of the second pads to an end of the second semiconductor chip is greater than or equal to ¾ of a distance from each of the first pads disposed along one side of the first semiconductor chip lying between the connecting terminals directly bonded from the second pads and the second pads, to each of the second pads.

4. The multichip package according to claim 2, wherein a thickness of the junction member is substantially the same as a thickness of the second chip.

5. The multichip package according to claim 2, wherein each of the matrices is a complete matrix.

6. The multichip package according to claim 1, wherein the second pads and the junction pads are bonded using metal wires, and a length of each of the metal wires extending from the second pads to the first junction pads does not exceed 3 mm.

7. The multichip package according to claim 1, wherein a distance extending from each of the second pads to an end of the second semiconductor chip is greater than or equal to ¾ of a distance from each of the first pads disposed along one side of the first semiconductor chip lying between the connecting terminals directly bonded from the second pads and the second pads, to each of the second pads.

8. The multichip package according to claim 1, wherein a thickness of the junction member is substantially the same as a thickness of the second chip.

9. The multichip package according to claim 1, wherein the second pads are arranged along a second direction that is substantially perpendicular to the first direction.

10. The multichip package according to claim 1, wherein each of the matrices is a complete matrix.

11. The multichip package according to claim 1, further comprising a wiring that connects the second junction pad directly to the one of the first pads.

12. The multichip package according to claim 1, wherein at least one of the first connecting terminals is directly connected to the second semiconductor chip and directly connected to the first semiconductor chip.

13. The multichip package according to claim 12, wherein said at least one of the first connecting terminal is wire-bonded directly to the second pad of the second semiconductor chip by a metal wire and wire-bonded directly to the first pad of the first semiconductor chip by another metal wire.

14. The multichip package according to claim 12, wherein the second connecting terminals are directly connected only to the first semiconductor chip, without being directly connected to the junction member or the second semiconductor chip.

15. The multichip package according to claim 1, wherein a top surface of the junction member is disposed at a level the same as or higher than a level at which a top surface of the second semiconductor chip is disposed.

16. The multichip package according to claim 1, further comprising a mold resin unit in which the first and second chips, the junction member and the die pad are embedded, wherein each lead frame includes an upper section extending in a horizontal direction, a middle section bent from the upper section and a lower section extending from the middle section in a direction parallel to the horizontal direction, at least a portion of the upper section being disposed embedded within the mold resin unit, the lower section being disposed outside the mold resin unit.

17. The multichip package according to claim 1, wherein the connecting terminals are spaced apart from the die pad.

18. A multichip package, comprising:
a plurality of connecting terminals arranged in a peripheral area of the package, the connecting terminals including first connecting terminals arranged in a first-side peripheral area of the package and second connecting terminals arranged in a second-side peripheral area of the package opposite to the first-side peripheral area;
a die pad;
a first semiconductor chip disposed on the die pad, the first semiconductor chip including a central surface, and a peripheral surface on which a plurality of first pads are formed, the first semiconductor chip being located within the peripheral area including the connecting terminals;
a second semiconductor chip disposed on the central surface of the first semiconductor chip, the second semiconductor chip being disposed closer to the first connecting terminals than the second connecting terminals, the second semiconductor chip including a plurality of second pads arranged in a central part thereof such that a distance from each second pad to a vertical edge of the second semiconductor chip that faces the first connecting terminals is substantially the same as a distance from each second pad to an opposite vertical edge of the second semiconductor chip that faces the second connecting terminals;
a junction member disposed on the central surface of the first semiconductor chip, the junction member being disposed closer to the second connecting terminals than the first connecting terminals; and
a resin encapsulating body which seals the first semiconductor chip, the second semiconductor chip, and the junction member;
wherein the second semiconductor chip and the junction member are arranged along a first direction that extends from the first-side peripheral area to the second-side peripheral area of the package,
wherein the junction member includes junction pads and pad connection portions, the junction pads consist of a plurality of junction pads all arranged in at least one rectangular matrix,
wherein the junction pads including m rows, each row extending along the first direction, each row including n junction pads that are electrically connected to one another along the first direction by the pad connecting portions, the junction pads in each row being arranged side-by-side, each pad connecting portion in each row being disposed between two adjacent junction pads, a size of each junction pad being larger than a size of each pad connecting portion, a junction pad that is most adjacent to the second-side peripheral area in the row being directly connected to one of the first pads,
wherein each of the matrices in which all the junction pads are arranged is a large m×n matrix where m and n are both integers greater than two,
wherein the junction member further includes sub pads, the sub pads consisting of a plurality of sub pads all arranged in a rectangular matrix, wherein the matrix in which all the sub pads are arranged is a k×l array, where k and l are both integers greater than one,
wherein the sub pads including l columns, each column extending along a second direction that is generally perpendicular to the first direction, each column including k junction pads that are electrically connected to one another along the second direction,
wherein the junction pads are disposed in a first layer and the sub pads are disposed in a second layer underlying the first layer in a third direction generally perpendicular to both of the first direction and the second direction, and the junction member further comprises a plurality of sub-connecting portions each of which connects between first and second sub pads in the second direction, and wherein the junction pads and the sub pads do not short circuit to one another,
wherein the second pads include a first central pad and a second central pad, the first central pad being directly connected to one of the first connecting terminals, the second central pad being connected to a junction pad in a row of the junction pads, and
wherein the connecting terminals are lead terminals extending outward from the package, and each lead terminal has a connecting portion for connecting to the first semiconductor chip or the second semiconductor chip, and wherein each connecting portion of the first and second terminals is disposed at a level higher than the die pad and lower than the second semiconductor chip and the junction member.

19. The multichip package according to claim 18, wherein the sub pads are exposed between the junction pads as seen along the third direction.

20. The multichip package according to claim 19 wherein the sub pads are arranged on alternate columns with respect to columns of the junction pads.

21. The multichip package according to claim 18, wherein the second pads further include a third central pad, and the third central pad is directly connected to a first sub pad in a column of the sub pads.

22. The multichip package according to claim 21, wherein:
a second sub pad in the column connected to the third central pad is connected to a first junction pad in a row of the junction pads; and
a second junction pad that is most adjacent to the second-side peripheral area in said row is connected to one of the first pads.

* * * * *